United States Patent
Iwai et al.

(10) Patent No.: US 10,587,374 B2
(45) Date of Patent: Mar. 10, 2020

(54) SIGNAL GENERATOR AND FREQUENCY CHARACTERISTIC DISPLAY METHOD USING SIGNAL GENERATOR

(71) Applicant: Anritsu Corporation, Kanagawa (JP)

(72) Inventors: Tatsuya Iwai, Kanagawa (JP); Hiroyuki Onuma, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 16/394,108

(22) Filed: Apr. 25, 2019

(65) Prior Publication Data
US 2020/0036486 A1 Jan. 30, 2020

(30) Foreign Application Priority Data
Jul. 24, 2018 (JP) ................................. 2018-138289

(51) Int. Cl.
*H04L 1/20* (2006.01)
*G01R 31/3193* (2006.01)
*G01R 31/317* (2006.01)
*H04L 1/24* (2006.01)

(52) U.S. Cl.
CPC .......... *H04L 1/203* (2013.01); *G01R 31/3171* (2013.01); *G01R 31/3193* (2013.01); *H04L 1/24* (2013.01)

(58) Field of Classification Search
CPC ..... H04L 25/03885; H04L 1/203; H04L 1/24; G01R 31/3171; G01R 31/3193; H03H 21/0012; H03H 7/40
See application file for complete search history.

(56) References Cited

U.S. PATENT DOCUMENTS

| 4,888,808 | A | * | 12/1989 | Ishikawa | ................ | H03G 5/005 |
|   |   |   |   |   |   | 381/103 |
| 10,270,543 | B2 | * | 4/2019 | Iwai | .................. | H04B 17/0085 |
| 2009/0319066 | A1 | * | 12/2009 | Tsuji | ........................ | H04R 3/04 |
|   |   |   |   |   |   | 700/94 |
| 2012/0121004 | A1 | * | 5/2012 | Chang | ...................... | H03H 7/40 |
|   |   |   |   |   |   | 375/232 |

(Continued)

FOREIGN PATENT DOCUMENTS

JP 2007-274474 A 10/2007

*Primary Examiner* — Khanh C Tran
(74) *Attorney, Agent, or Firm* — Pearne & Gordon LLP

(57) ABSTRACT

A signal generator includes inverse characteristic calculation means for calculating an inverse characteristic of a transfer function from an inverse characteristic of a frequency characteristic of a signal based on the transmission standard, inverse Fourier transform means for calculating impulse responses of a plurality of points by performing inverse Fourier transform on the inverse characteristic of the transfer function, impulse response cutout means for cutting out the points for a predetermined number of taps from the impulse response, frequency characteristic calculation means for calculating a frequency characteristic based on values of the points for the number of taps cut out from the impulse response, and display control means for displaying on a display screen, the frequency characteristic calculated by the frequency characteristic calculation means and an ideal frequency characteristic read from an S parameter file of a device under test.

8 Claims, 6 Drawing Sheets

(56) References Cited

U.S. PATENT DOCUMENTS

| | | | |
|---|---|---|---|
| 2012/0166123 A1* | 6/2012 | Hino | G01H 17/00 702/89 |
| 2013/0050539 A1* | 2/2013 | Watanabe | G06T 5/003 348/241 |
| 2015/0146996 A1* | 5/2015 | Watanabe | G06T 5/10 382/260 |

* cited by examiner

SIGNAL GENERATOR AND FREQUENCY CHARACTERISTIC DISPLAY METHOD USING SIGNAL GENERATOR

TECHNICAL FIELD

The present invention relates to a signal generator for generating a signal with a desired loss value in order to test a device (DUT: device under test) compliant with the digital signal transmission standard, and a frequency characteristic display method using the signal generator.

BACKGROUND ART

For example, as disclosed in the following Patent Document 1, an error rate measuring apparatus is conventionally known as an apparatus which transmits a test signal including fixed data to a device under test such as a photoelectric conversion component, and measures a bit error rate (BER) by comparing a measured signal which is input through the object to be measured with a reference signal which is a standard on a bit basis.

Meanwhile, as a device under test of this type of error rate measuring apparatus, in a device compliant with digital signal transmission standards such as PCIeGen 4.0, USB 3.0/3.1, Thunderbolt, or the like, for example, in order to evaluate the characteristics of a test board for each transmission standard, it is necessary to introduce an ISI calibration channel which is a test fixture simulating a prescribed transmission line loss, in input to a test board.

However, the amount of loss of the ISI calibration channel varies according to transmission standards. Therefore, the user needs to prepare a loss board of the ISI calibration channel conforming to the transmission standard separately from the test board for each transmission standard.

RELATED ART DOCUMENT

Patent Document

[Patent Document 1] JP-A-2007-274474

DISCLOSURE OF THE INVENTION

Problem that the Invention is to Solve

Meanwhile, in a case of simulating the frequency characteristics of the ISI calibration channel with the finite impulse response (FIR) filter, the number of taps of the FIR filter affects the deviation from the ideal frequency characteristic, and as the number of taps decreases, the amount of deviation from the ideal frequency characteristic increases. Further, since steep frequency characteristics cannot be simulated with a FIR filter with small number of taps, the reproduction may be impossible depending on the simulated frequency characteristics in some cases.

Thus, since the frequency characteristics are simulated with the FIR filter, even though there is a limit to simulation, the index is invisible to the user and cannot be visually recognized by the user. Therefore, the user is not able to directly determine whether the frequency characteristic can be simulated correctly or not.

The present invention has been made in view of the above problems, and an object of the present invention is to provide a signal generator capable of visualizing the degree of reproduction of a waveform by a FIR filter and a frequency characteristic display method using the signal generator.

Means for Solving the Problem

In order to achieve the above purpose, a signal generator described in a first aspect of the present invention is a signal generator including:

inverse characteristic calculation means for, based on information representing a frequency characteristic which simulates a prescribed transmission line loss, calculating an inverse characteristic of a transfer function from an inverse characteristic of the frequency characteristic, in order to test a device under test;

inverse Fourier transform means for calculating an impulse response composed of a plurality of points, from the inverse characteristic of the frequency characteristic;

impulse response cutout means for cutting out the points for the number of taps in a desired range with a reference to a peak of an amplitude of the impulse response calculated by the inverse Fourier transform means, from the impulse response;

tap coefficient calculation means for calculating tap coefficients for the number of taps;

signal generation means for generating a signal with a loss which simulates the prescribed transmission line loss, by setting the calculated tap coefficient in a finite impulse response (FIR) filter;

a display screen;

frequency characteristic calculation means for calculating a frequency characteristic based on values of the points for the number of taps in the desired range cut out from the impulse response by the impulse response cutout means; and display control means for identifying and displaying on the display screen, the frequency characteristic calculated by the frequency characteristic calculation means and an ideal frequency characteristic based on information representing the simulated frequency characteristic.

In the signal generator described in a second aspect, the information representing the frequency characteristic of the device under test is an S parameter file.

In the signal generator described in a third aspect, the identifying and displaying is displaying the frequency characteristics so as to be distinguishable by changing at least one of color classification, line type, and line thickness, on a graph on the display screen, with a horizontal axis as a frequency, and a vertical axis as an amplitude.

In the signal generator described in a fourth aspect, the display control means performs display control of the display means by adding the inverse characteristic of the frequency characteristic calculated by the frequency characteristic calculation means to the ideal frequency characteristic read from the information representing the frequency characteristic of the device under test.

A frequency characteristic display method using a signal generator having a display screen described in a fifth aspect is a frequency characteristic display method using a signal generator, including a step of, based on information representing a frequency characteristic which simulates a prescribed transmission line loss, calculating an inverse characteristic of a transfer function from an inverse characteristic of the frequency characteristic, in order to test a device under test;

a step of calculating an impulse response composed of a plurality of points, from the inverse characteristic of the frequency characteristic;

a step of cutting out the points for the number of taps in a desired range with a reference to a peak of an amplitude of the impulse response, from the impulse response;

a step of calculating the frequency characteristic based on values of the points for the number of taps in the desired range cut out from the impulse response a step of calculating tap coefficients for the number of taps;

a step of generating a signal with a loss which simulates the prescribed transmission line loss, by setting the calculated tap coefficient in a finite impulse response (FIR) filter; and a step of identifying and displaying a frequency characteristic calculated based on values of the points for the number of taps in the desired range cut out from the impulse response and an ideal frequency characteristic based on information representing the simulated frequency characteristic, on the display screen.

In the frequency characteristic display method described in a sixth aspect, the information representing the frequency characteristic of the device under test is an S parameter file.

In the frequency characteristic display method described in a seventh aspect, the identifying and displaying is displaying the frequency characteristics so as to be distinguishable by changing at least one of color classification, line type, and line thickness, on a graph on the display screen, with a horizontal axis as a frequency, and a vertical axis as an amplitude.

In the frequency characteristic display method described in an eighth aspect, the display means is controlled by adding an inverse characteristic of the frequency characteristic calculated by the frequency characteristic calculation means to an ideal frequency characteristic read from the information representing the frequency characteristic of the device under test.

Advantage of the Invention

According to the present invention, the degree of reproduction of a waveform by the FIR filter can be visualized, so the user views the visualized degree and is able to directly determine whether the frequency characteristic can be simulated correctly or not.

BEST MODE FOR CARRYING OUT THE INVENTION

Hereinafter, best modes for carrying out the present invention will be described in detail with reference to the accompanying drawings.

The signal generator according to the present invention generates a signal (hereinafter referred to as an ISI signal) applied with an inter symbol interference (ISI) based on a desired loss value (the amount of loss) based on the transmission standard of a digital signal, in order to test a device compliant with the transmission standard of digital signals. Incidentally, the transmission standards of digital signals to which the present invention is applied include PCIeGen 4.0, USB 3.0/3.1, Thunderbolt, and the like.

Figure 1:
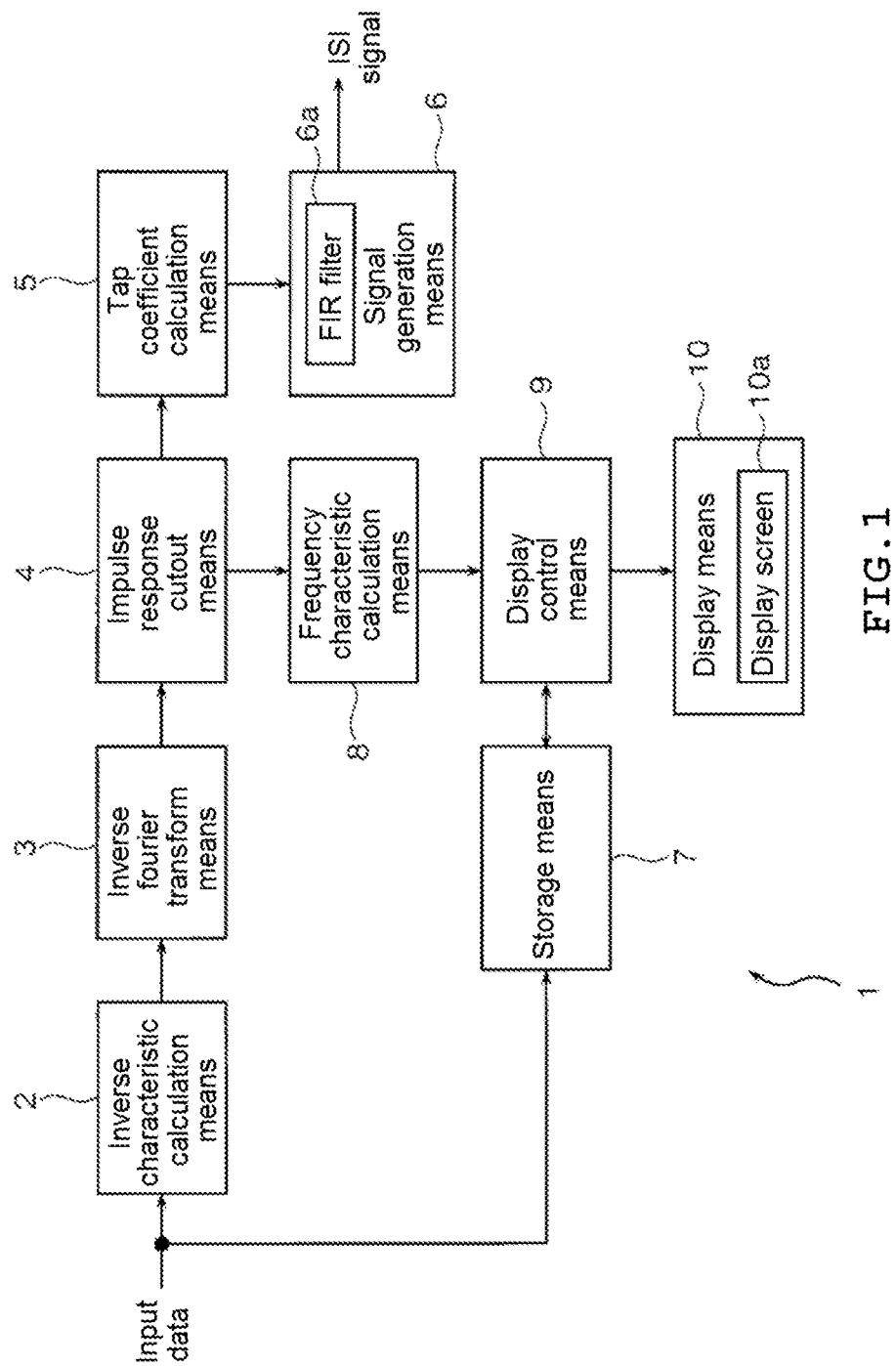
FIG. 1 is a block diagram showing a schematic configuration of a signal generator according to the present invention.

As shown in FIG. 1, in order to provide a platform enabling a user to recognize at a glance an ideal frequency characteristic and a frequency characteristic to be actually simulated, a signal generator 1 according to the present embodiment includes inverse characteristic calculation means 2, inverse Fourier transform means 3, impulse response cutout means 4, tap coefficient calculation means 5, signal generation means 6, storage means 7, frequency characteristic calculation means 8, display control means 9, and display means 10.

The inverse characteristic calculation means 2 calculates a transfer function and an inverse characteristic thereof, from the inverse characteristic of the frequency characteristic of input data, with a signal based on the transmission standard of a digital signal and the frequency characteristic of a device (device under test) to be simulated actually as the input data.

The inverse Fourier transform means 3 performs an inverse Fourier transform on the inverse characteristic of the transfer function calculated from the inverse characteristic of the frequency characteristic to be actually simulated by the inverse characteristic calculation means 2 to calculate an impulse response composed of a plurality of points.

The impulse response cutout means 4 cuts out points for the number of taps in a desired range (for example, 10 taps: 6 post 3 pre) from the impulse response with reference to the peak of the amplitude of the impulse response obtained by the inverse Fourier transform means 3.

The value (tap value) cut out from the impulse response is a filter coefficient of a FIR filter 6a (to be described later) for distorting the input waveform to the test board and is used for obtaining the tap coefficient.

The tap coefficient calculation means 5 calculates a tap coefficient by obtaining the gain/loss ratio therefrom with reference to a main tap of the FIR filter 6a to be described later, by using the values of the points cut out from the impulse response by the impulse response cutout means 4.

The signal generation means 6 includes the FIR filter 6a, and sets the tap coefficient calculated by the tap coefficient calculation means 5 in the FIR filter 6a, and generates an ISI signal of frequency characteristics compliant with the desired transmission standard for distorting the input wave to the test board.

Figure 2:
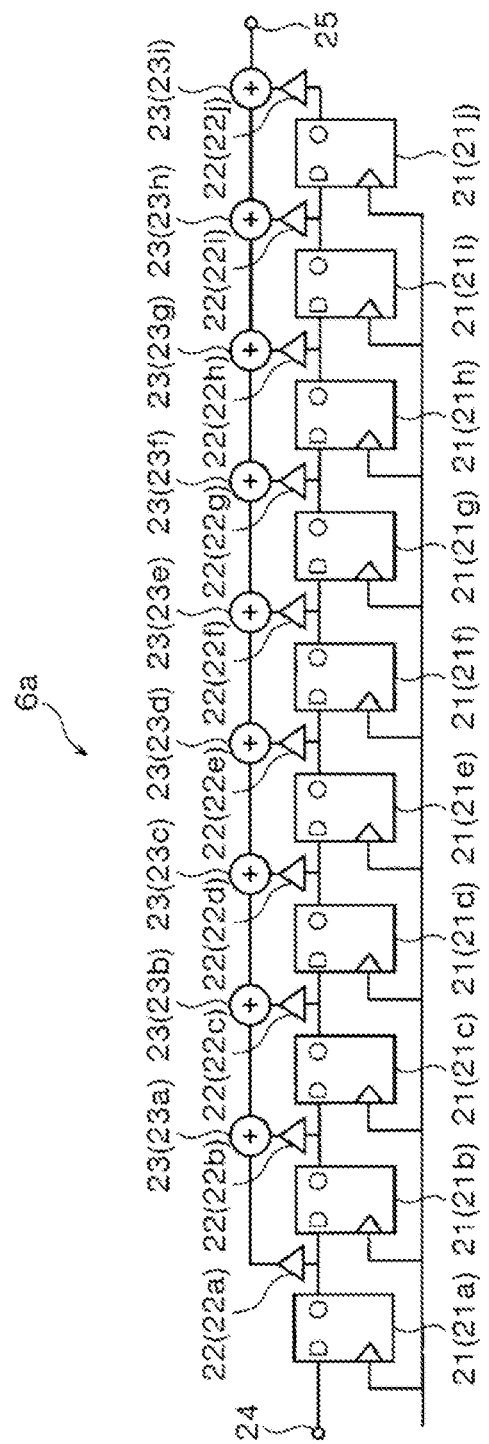
FIG. 2 is a diagram showing a configuration example of a FIR filter used in the present invention.

In the case of, for example, ten taps, as shown in FIG. 2, the FIR filter 6a includes ten delay circuits 21 (21a, 21b, 21c, 21d, 21e, 21f, 21g, 21h, 21i, and 21j) such as D-type flip flops, ten multipliers 22 (22a, 22b, 22c, 22d, 22e, 22f, 22g, 22h, 22i, and 22j), and nine adders 23 (23a, 23b, 23c, 23d, 23e, 23f, 23g, 23h, and 23i). Ten delay circuits 21a, 21b, 21c, 21d, 21e, 21f, 21g, 21h, 21i, and 21j are connected in series between the input terminal 24 and the output terminal 25 to form ten taps.

Ten multipliers 22a, 22b, 22c, 22d, 22e, 22f, 22g, 22h, 22i, and 22j for multiplying the set tap coefficients are connected to respective taps of the FIR filter 6a. The outputs of the stages before and after the ten multipliers 22a, 22b, 22c, 22d, 22e, 22f, 22g, 22h, 22i, and 22j are connected to the corresponding stages of the nine adders 23a, 23b, 23c, 23d, 23e, 23f, 23g, 23h, and 23i. Then, the FIR filter 6a calculates and outputs the sum of multiplication results of the ten multipliers 22a, 22b, 22c, 22d, 22e, 22f, 22g, 22h, 22i, and 22j.

The storage means 7 uses an S parameter file ($S_{21}$: transmission characteristic) indicating a frequency characteristic of a device to be simulated of the ISI calibration channel as input data and stores an S parameter file of the device.

The frequency characteristic calculation means 8 calculates a frequency characteristic by inverse Fourier transform from the tap value of the impulse response cut out by the impulse response cutout means 4.

The display control means 9 reads an ideal frequency characteristic from the S parameter file ($S_{21}$: transmission characteristic) of the device to be simulated of the ISI calibration channel stored in the storage means 7, and controls the display means 10 such that the read ideal frequency characteristic is displayed on a graph (horizontal axis: frequency [GHz], and vertical axis: amplitude [dB]) on the display screen 10a of the display means 10.

Further, the display control means 9 controls the display means 10 such that the frequency characteristic calculated by the frequency characteristic calculation means 8 is displayed on the graph on the display screen 10a of the display means 10 so as to be distinguishable from the ideal frequency characteristic.

The display means 10 is a display device such as a liquid crystal display provided in the main body of the apparatus, for example, and under the control of the display control means 9, displays the ideal frequency characteristic F1 read from the S parameter file and the frequency characteristic F2 calculated by the frequency characteristic calculation means 8 on a graph (horizontal axis: frequency [GHz], and vertical axis: amplitude [dB]) on the display screen 10a so as to be distinguishable from each other, for example, by changing color classification, line type, line thickness, or the like. For example, the ideal frequency characteristic (DUT S-Parameter) F1 is identified and displayed by a solid line and the frequency characteristic (Emulate S-Parameter) F2 calculated by the frequency characteristic calculation means 8 is identified and displayed by a dotted line, on the graph on the display screen 10a of the display form shown in FIGS. 4 and 5.

In the present embodiment, the S parameter file of the device is stored in the storage means 7, but when simulating the ISI calibration channel with the FIR filter 6a, the S parameter file of a device to be simulated may be fetched from an external device, an external medium, or the like.

[Frequency Characteristic Display Method]

Figure 3:
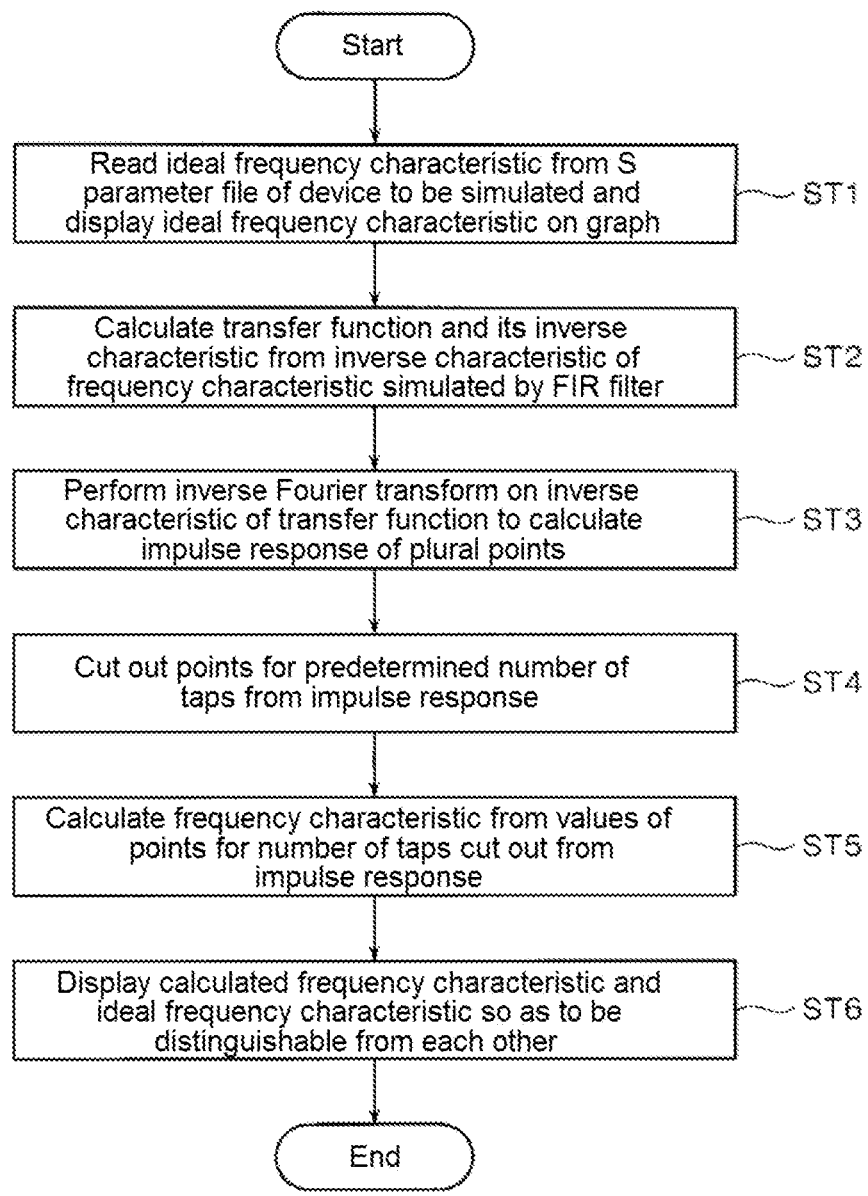
FIG. 3 is a flowchart of a frequency characteristic display method using the signal generator according to the present invention.

Next, a frequency characteristic display method using the signal generator 1 configured as described above will be described with reference to FIGS. 3 to 5.

In a case of simulating the ISI calibration channel with the FIR filter 6a, the display control means 9 reads the S parameter file of a device to be simulated from the storage means 7, and reads an ideal frequency characteristic from the read S parameter file to display the ideal frequency characteristic on the graph on the display screen 10a of the display means 10 (ST1). For example, the ideal frequency characteristic (solid line) F1 is displayed on the graph on the display screen 10a of each of the display forms shown in FIGS. 4 and 5. The S parameter file of the device stored in the storage means 7 can be read out by pressing "Open" composed of soft keys on the display screens 10a of FIG. 4 and FIG. 5, for example.

Next, the inverse characteristic calculation means 2 calculates the transfer function and its inverse characteristic from the inverse characteristic of the frequency characteristic simulated by the FIR filter 6a (ST2). Then, the inverse Fourier transform means 3 performs an inverse Fourier transform on the inverse characteristic of the transfer function calculated by the inverse characteristic calculation means 2 to calculate an impulse response of a plurality of points (ST3).

Next, the impulse response cutout means 4 cuts out points for a predetermined number of taps from the impulse response calculated by the inverse Fourier transform means 3 (ST4). Subsequently, the frequency characteristic calculation means 8 calculates a frequency characteristic by inverse Fourier transform from the values of points for the number of taps cut out from the impulse response by the impulse response cutout means 4 (ST5).

Then, the display control means 9 displays the frequency characteristic calculated by the frequency characteristic calculation means 8 by superimposing the frequency characteristic on the graph on the display screen 10a of the display means 10 so as to be distinguishable from the ideal frequency characteristic (ST6). For example, the frequency characteristic (dotted line) F2 calculated by the frequency characteristic calculation means 8 and the ideal frequency characteristic (solid line) F1 are superimposed so as to be distinguishable from each other and displayed on the graph on the display screen 10a of the display form shown in FIGS. 4 and 5.

Figure 4:
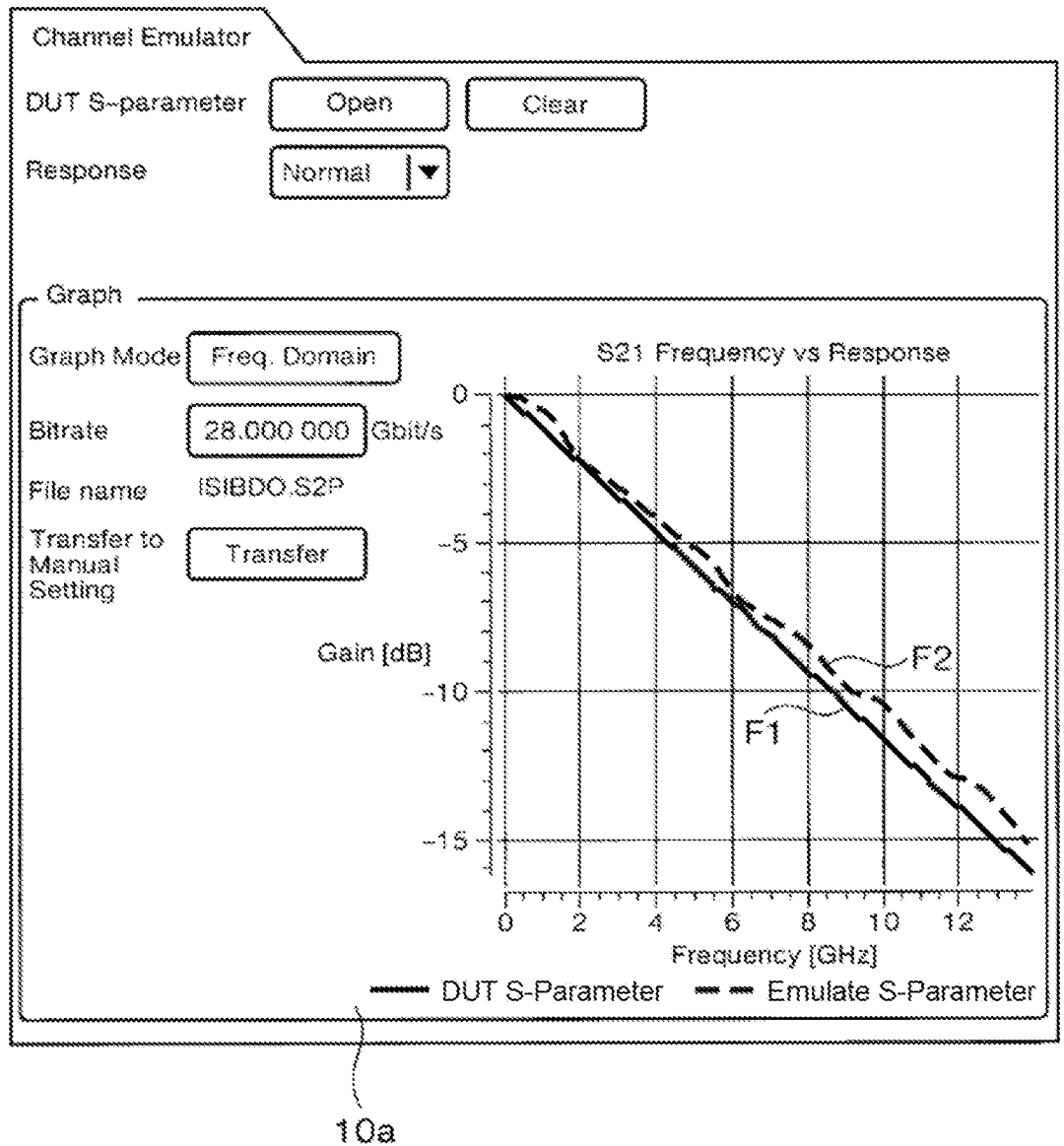
FIG. 4 is a diagram showing a display example in a state where reproduction of a waveform by the FIR filter is possible.
Figure 5:
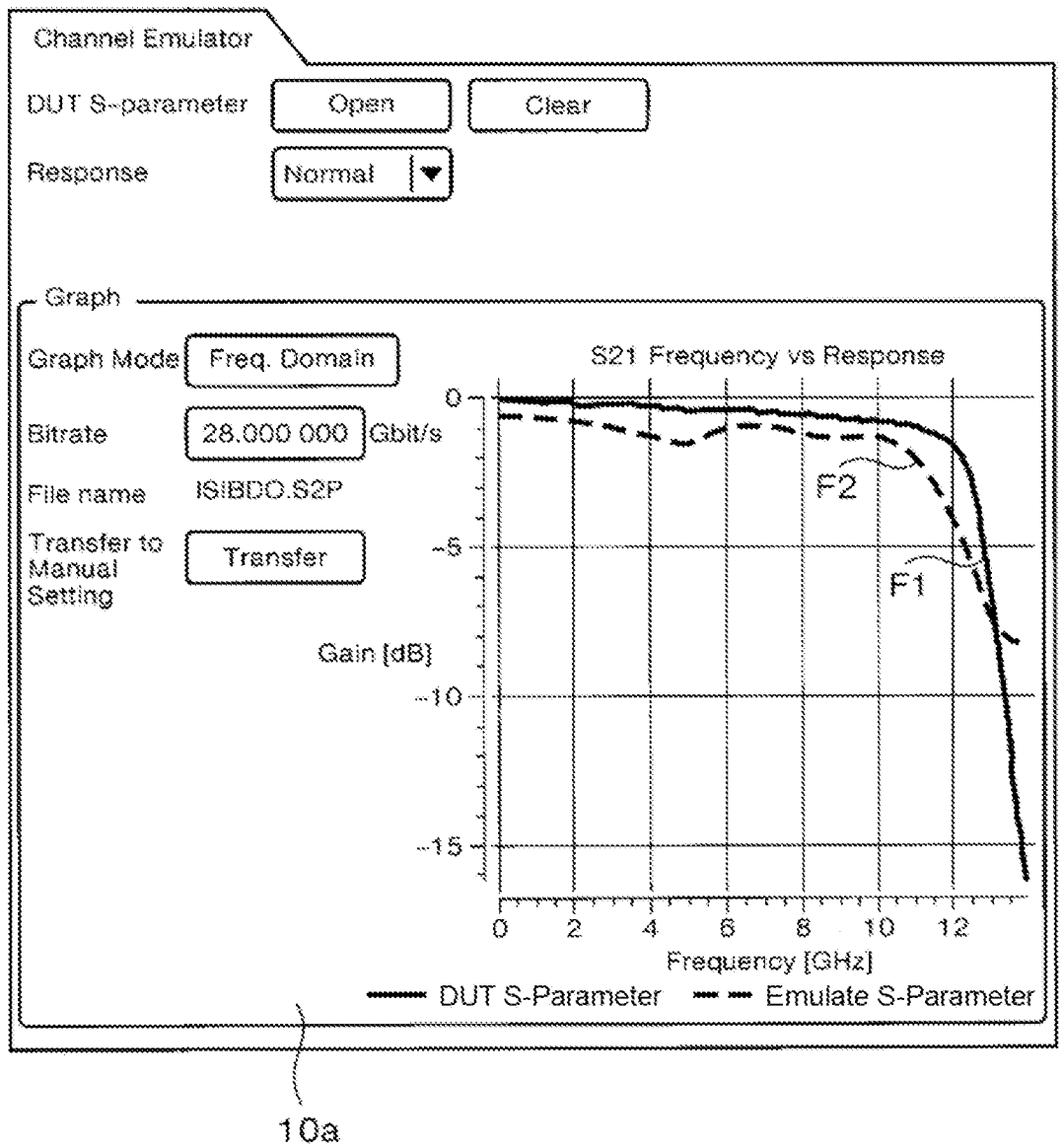
FIG. 5 is a diagram showing a display example in a state where reproduction of a waveform by the FIR filter is impossible.

Here, FIG. 4 shows a display example in a state where reproduction of a waveform by the FIR filter 6a is possible, and FIG. 5 shows a display example in a state where reproduction of a waveform by the FIR filter 6a is impossible.

In a case where the frequency characteristic can be sufficiently simulated for the number of taps of the FIR filter 6a, as shown in FIG. 4, the frequency characteristic (Emulate S-Parameter: dotted line) F2 calculated by the frequency characteristic calculation means 8 and the ideal frequency characteristic (DUT S-Parameter: solid line) F1 are close to each other.

On the other hand, for example, even when the amount of loss at the Nyquist frequency is the same as in FIG. 4, in a case where the change in frequency characteristics is steep, as shown in FIG. 5, the frequency characteristic (Emulate S-Parameter: dotted line) F2 calculated by the frequency characteristic calculation means 8 and the ideal frequency characteristic (DUT S-Parameter: solid line) F1 do not indicate values close to each other, and the waveform by the FIR filter 6a cannot be reproduced.

In addition to this, the reproducing of the characteristics of a device having a steep frequency characteristic such as LPF is impossible, but the ideal frequency characteristic and the actually simulated frequency characteristic are displayed so as to be distinguishable as in the present embodiment, and are visible at a glance.

[ISI Signal Generation Method]

Figure 6:
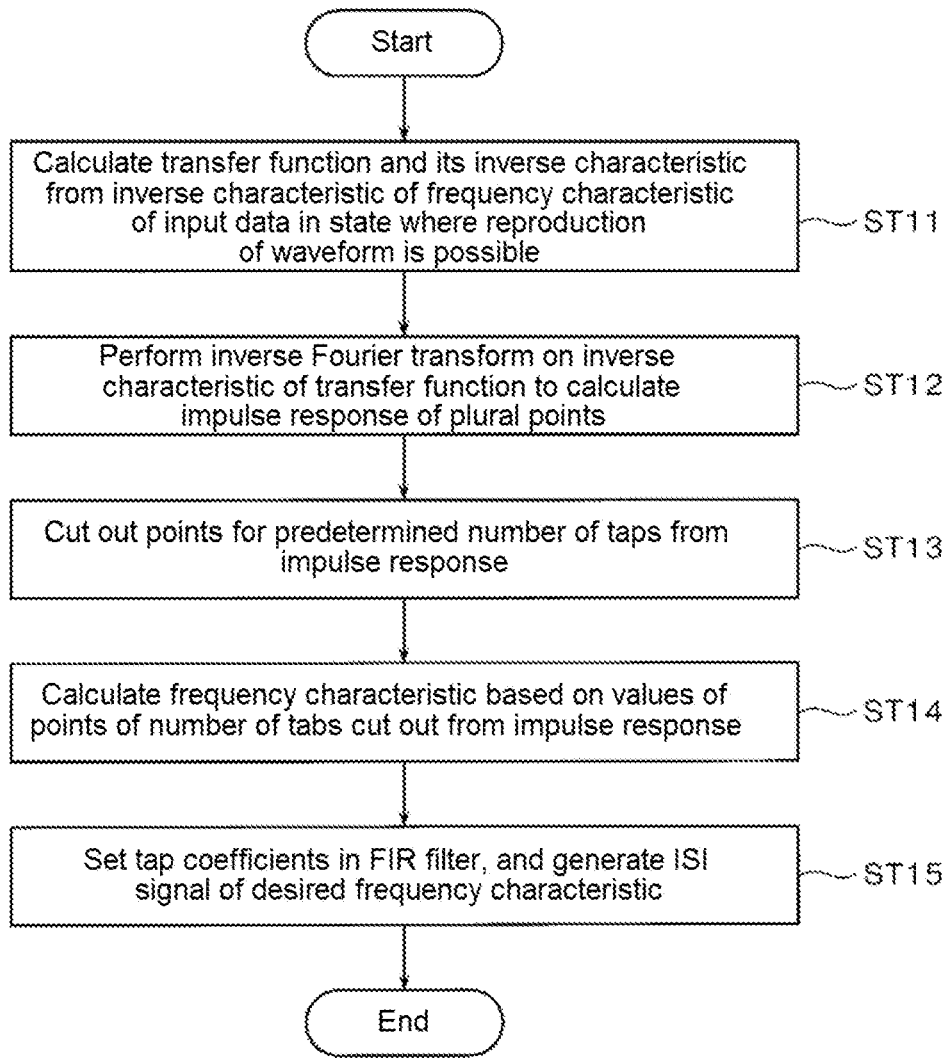
FIG. 6 is a flowchart of a method of generating an ISI signal using the signal generator according to the present invention.

Next, a method of generating an ISI signal by the signal generator 1 will be described with reference to FIG. 6.

The inverse characteristic calculation means 2 calculates the transfer function and its inverse characteristic from the inverse characteristic of the frequency characteristic of input data in a state where reproduction of a waveform by the FIR filter 6a is possible, by the above-described frequency characteristic display method (ST11).

Next, the inverse Fourier transform means 3 performs an inverse Fourier transform on the inverse characteristic of the transfer function calculated by the inverse characteristic calculation means 2 to calculate an impulse response of a plurality of points (ST12).

Next, the impulse response cutout means 4 cuts out points for a predetermined number of taps from the impulse response calculated by the inverse Fourier transform means 3 (ST13).

Next, the tap coefficient calculation means 5 calculates a tap coefficient by the gain/loss ratio therefrom with reference to the tap of Main of the FIR filter 6a, by using the values of the points cut out from the impulse response by the impulse response cutout means 4 (ST14).

Then, the signal generation means 6 sets the tap coefficients calculated by the tap coefficient calculation means 5 in the FIR filter 6a, and generates an ISI signal of a desired frequency characteristic (ST15).

As described above, according to the present embodiment, an ideal frequency characteristic is read from the S parameter file of a device to be simulated, and displayed on a graph. Further, a frequency characteristic is calculated by inverse Fourier transformation from the tap value of the impulse response in a case of simulating an ideal frequency characteristic by the FIR filter is calculated, and the calculated frequency characteristic and the ideal frequency characteristic are displayed so as to be distinguishable from each other. This makes it possible to visualize the degree of reproduction of a waveform by the FIR filter, and it is possible to easily check what extent of the ideal frequency characteristic the actually simulated frequency characteristic is simulated, by comparing the ideal frequency characteristic with the actually simulated frequency characteristic on the display screen.

Meanwhile, the display control means 9 performs display control of the display means 10 by adding the inverse characteristic of the frequency characteristic calculated by the frequency characteristic calculation means 8 to the ideal frequency characteristic read from the S parameter file of the device stored in the storage means 7. In this case, on the display screen of the display means 10, the difference in amplitude between the frequency characteristic calculated by the frequency characteristic calculation means 8 and the ideal frequency characteristic is displayed. Thus, the user can determine whether or not the difference in amplitude falls within an allowable range, and whether or not the loss can be corrected correctly, by seeing the difference in amplitude on the display screen.

Although the best mode of the signal generator and the frequency characteristic display method using the signal generator has been described above, the present invention is not limited by the description and drawings according to this mode. In other words, it is a matter of course that other modes, examples, operation techniques and the like made by those skilled in the art based on this mode are all included in the scope of the present invention.

DESCRIPTION OF REFERENCE NUMERALS AND SIGNS

1 Signal Generator
2 Inverse Characteristic Calculation Means
3 Inverse Fourier Transform Means
4 Impulse Response Cutout Means
5 Tap Coefficient Calculating Means
6 Signal Generation Means
6a FIR Filter
7 Storage Means
8 Frequency Characteristic Calculation Means
9 Display Control Means
10 Display Means
10a Display Screen
21 (21a, 21b, 21c, 21d, 21e, 21f, 21g, 21h, 21i, 21j) Delay Circuit
22 (22a, 22b, 22c, 22d, 22e, 22f, 22g, 22h, 22i, 22j) Multiplier
23 (23a, 23b, 23c, 23d, 23e, 23f, 23g, 23h, 23i, 23j) Adder
24 Input Terminal
25 Output Terminal
F1 Ideal Frequency Characteristic (Solid Line)
F2 Simulated Frequency Characteristic (Dotted Line)

What is claimed is:

1. A signal generator comprising:
   inverse characteristic calculation means for, based on information representing a frequency characteristic which simulates a prescribed transmission line loss, calculating an inverse characteristic of a transfer function from an inverse characteristic of the frequency characteristic;
   inverse Fourier transform means for calculating an impulse response composed of a plurality of points, from the inverse characteristic of the frequency characteristic;
   impulse response cutout means for cutting out the points for the number of taps in a desired range with a reference to a peak of an amplitude of the impulse response calculated by the inverse Fourier transform means, from the impulse response;
   tap coefficient calculation means for calculating tap coefficients for the number of taps;
   signal generation means for generating a signal with a loss which simulates the prescribed transmission line loss, by setting the calculated tap coefficient in a finite impulse response (FIR) filter;
   a display screen;
   frequency characteristic calculation means for calculating a frequency characteristic based on values of the points for the number of taps in the desired range cut out from the impulse response by the impulse response cutout means; and
   display control means for identifying and displaying on the display screen, the frequency characteristic calculated by the frequency characteristic calculation means and an ideal frequency characteristic based on information representing the simulated frequency characteristic.

2. The signal generator according to claim 1, wherein the information representing the frequency characteristic of the prescribed transmission line loss is an S parameter file.

3. The signal generator according to claim 1, wherein the identifying and displaying is displaying the frequency characteristics so as to be distinguishable by changing at least one of color classification, line type, and line thickness, on a graph on the display screen, with a horizontal axis as a frequency, and a vertical axis as an amplitude.

4. The signal generator according to claim 1, wherein the display control means performs display control of the display means by adding the inverse characteristic of the frequency characteristic calculated by the frequency characteristic calculation means to the ideal frequency characteristic read from the information representing the frequency characteristic of the prescribed transmission line loss.

5. A frequency characteristic display method using a signal generator having a display screen, comprising:
   a step of, based on information representing a frequency characteristic which simulates a prescribed transmission line loss, calculating an inverse characteristic of a transfer function from an inverse characteristic of the frequency characteristic;

a step of calculating an impulse response composed of a plurality of points, from the inverse characteristic of the frequency characteristic;

a step of cutting out the points for the number of taps in a desired range with a reference to a peak of an amplitude of the impulse response, from the impulse response;

a step of calculating the frequency characteristic based on values of the points for the number of taps in the desired range cut out from the impulse response;

a step of calculating tap coefficients for the number of taps;

a step of generating a signal with a loss which simulates the prescribed transmission line loss, by setting the calculated tap coefficient in a finite impulse response (FIR) filter; and a step of identifying and displaying a frequency characteristic calculated based on values of the points for the number of taps in the desired range cut out from the impulse response and an ideal frequency characteristic based on information representing the simulated frequency characteristic, on the display screen.

6. The frequency characteristic display method according to claim 5, wherein the information representing the frequency characteristic of the prescribed transmission line loss is an S parameter file.

7. The frequency characteristic display method according to claim 5, wherein the identifying and displaying is displaying the frequency characteristics so as to be distinguishable by changing at least one of color classification, line type, and line thickness, on a graph on the display screen, with a horizontal axis as a frequency, and a vertical axis as an amplitude.

8. The frequency characteristic display method according to claim 5, wherein the display means is controlled by adding an inverse characteristic of the frequency characteristic calculated by the frequency characteristic calculation means to an ideal frequency characteristic read from the information representing the frequency characteristic of the prescribed transmission line loss.

* * * * *